United States Patent [19]

Akasaki et al.

[11] Patent Number: 4,855,249

[45] Date of Patent: Aug. 8, 1989

[54] PROCESS FOR GROWING III-V COMPOUND SEMICONDUCTORS ON SAPPHIRE USING A BUFFER LAYER

[75] Inventors: Isamu Akasaki; Nobuhiko Sawaki, both of Nagoya, Japan

[73] Assignee: Nagoya University, Japan

[21] Appl. No.: 272,081

[22] Filed: Mar. 16, 1988

Related U.S. Application Data

[63] Continuation of Ser. No. 931,822, Nov. 18, 1986, abandoned.

[30] Foreign Application Priority Data

Nov. 18, 1985 [JP] Japan .................................. 60-256806

[51] Int. Cl.$^4$ .................... H01L 21/205; H01L 21/20
[52] U.S. Cl. ............................ 437/81; 148/DIG. 25; 148/DIG. 72; 148/DIG. 97; 148/DIG. 110; 148/DIG. 113; 156/613; 357/17; 437/84; 437/111; 437/127; 437/133; 437/905; 437/976
[58] Field of Search .................... 148/DIG. 1, 25, 56, 148/65, 72, 97, 99, 110, 119, 113; 156/610–615; 357/17, 16; 437/23, 81, 84, 111, 109, 126, 127, 133, 904, 905, 973, 976

[56] References Cited

U.S. PATENT DOCUMENTS

| | | | |
|---|---|---|---|
| 3,922,475 | 11/1975 | Manasevit | 156/612 |
| 4,062,706 | 12/1977 | Ruehrwein | 148/175 |
| 4,120,706 | 10/1978 | Mason | 148/175 |
| 4,144,116 | 3/1979 | Jacob et al. | 156/611 |
| 4,147,571 | 4/1979 | Stringfellow et al. | 148/175 |
| 4,177,321 | 12/1979 | Nishizawa | 148/175 |
| 4,554,030 | 11/1985 | Haisma et al. | 148/175 |
| 4,561,916 | 12/1985 | Akiyama et al. | 148/175 |
| 4,614,961 | 9/1986 | Khan et al. | 357/30 |

OTHER PUBLICATIONS

G. D. O'Clock, Jr. et al. "Acoustic Surface Wave Properties . . . of Aluminum Nitride . . . ", J. Electrochem. Soc., vol. 81, 1975, pp. 55–56.

Mizuta et al., "Low Temperatures Growth of GaN and Aln on GaAs . . . ", Jap. J. Appl. Phys., vol. 25, No. 12, Dec. 1986, pp. L945–L948.

Matloubian et al., "MOCVD Epitaxial Growth of Single Crystal GaN, A;N and $Al_xGa_{1-x}N$", J. of Elect. Mat., vol. 14, No. 5, 1985, pp. 633–644.

Morita et al., "Epitaxial Growth of Aluminum Nitride on Sapphire . . . ", Jap. J. Appl. Phys., vol. 20, No. 1, Jan. 1981, pp. 17–23.

Khan et al., "Properties and Ion Implanted $Al_xGa_{1-x}N$ Epitaxial Single Crystal Films . . . ", Appl. Phys. Lett., vol. 43, 1983, pp. 492–495.

Primary Examiner—Brian E. Hearn
Assistant Examiner—William Bunch
Attorney, Agent, or Firm—Sughrue, Mion, Zinn, Macpeak & Seas

[57] ABSTRACT

In organometallic vapor phase hetero-epitaxial processes for growing $Al_xGa_{1-x}N$ films on a sapphire substrate, the substrate is subjected to a preheat treatment of brief duration, such as less than 2 minutes, at relatively low temperatures in an atmosphere comprising Al-containing organometallic compound, $NH_3$ and $H_2$ gases, prior to the hetero epitaxial growth of $Al_xGa_{1-x}N$ films. Thus, single crystalline $Al_xGa_{1-x}N$ layers of high uniformity and high quality having smooth, flat surfaces are provided. Multi-layers grown according to the process of the invention are free from cracks and have preferable UV or blue light emission properties.

9 Claims, 6 Drawing Sheets

FIG_1
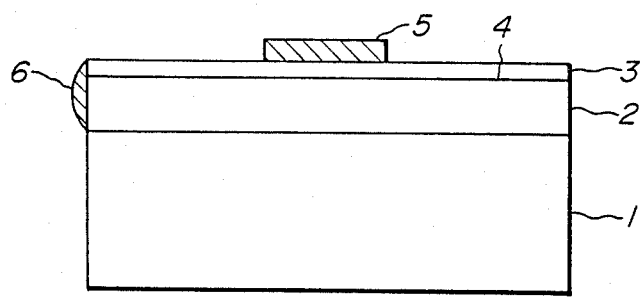
FIG_2
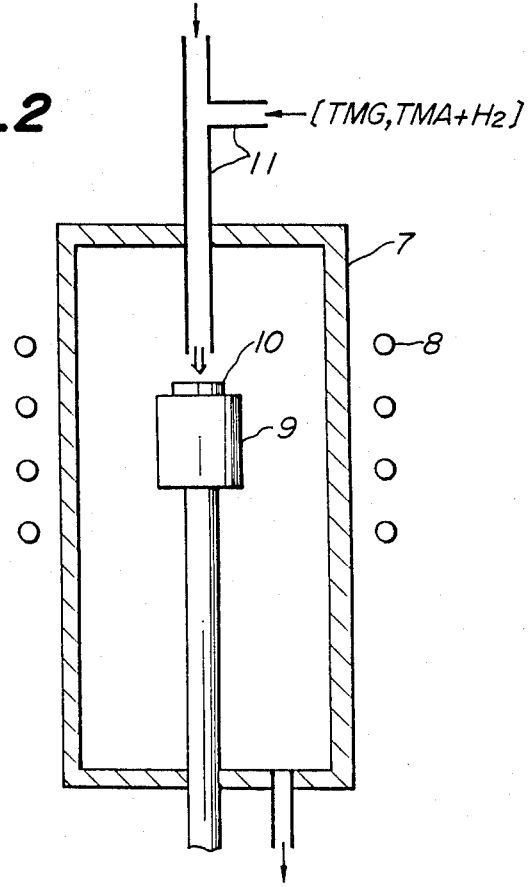

FIG_3
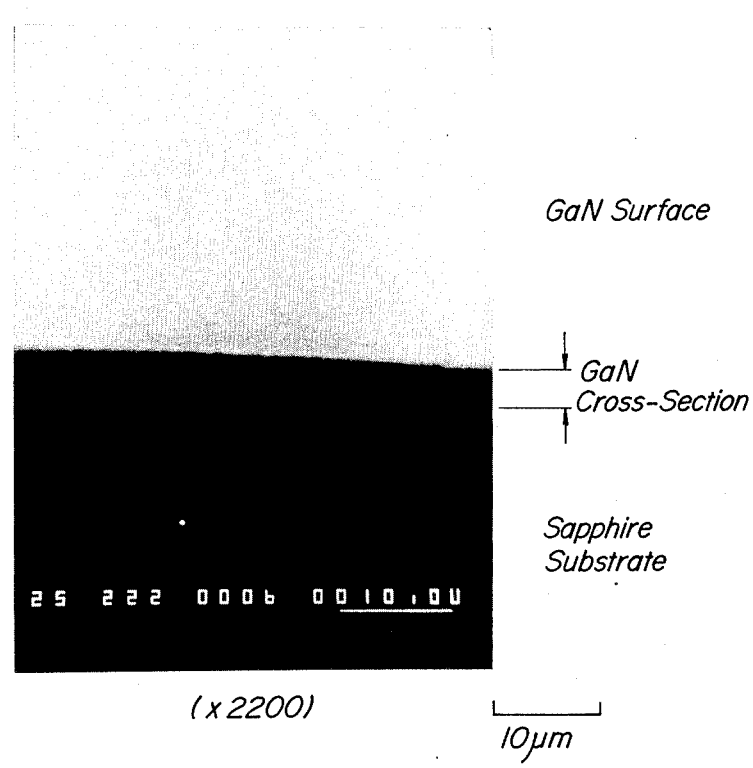
(x2200)
10μm

FIG_4
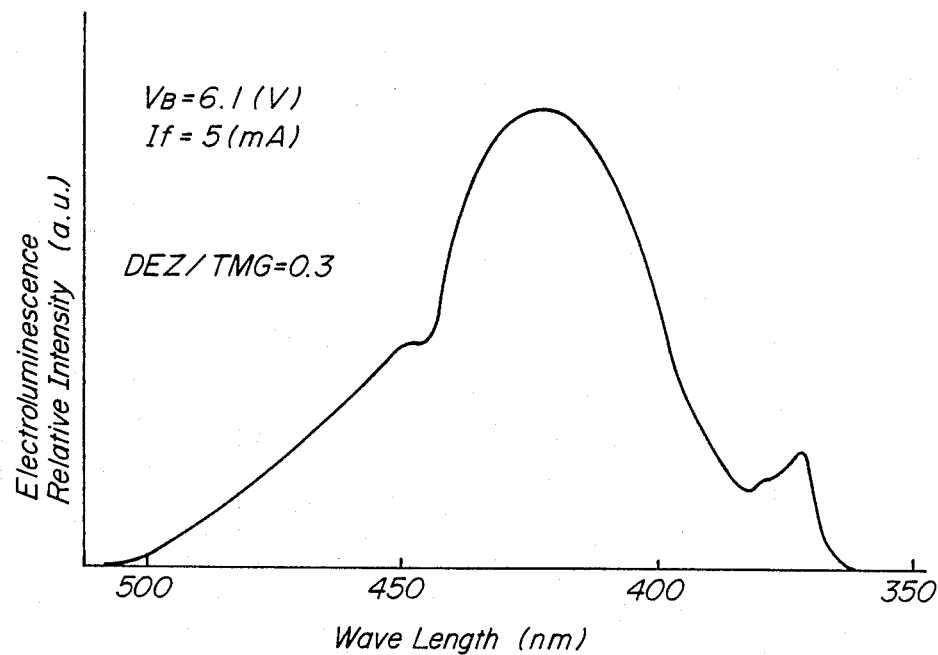

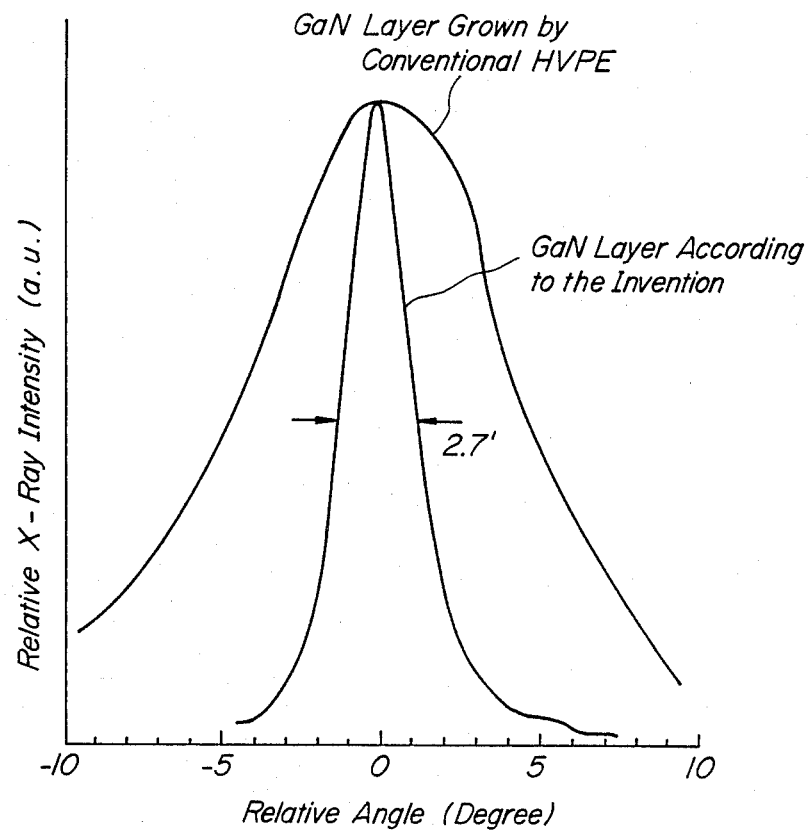
FIG_5

FIG_6
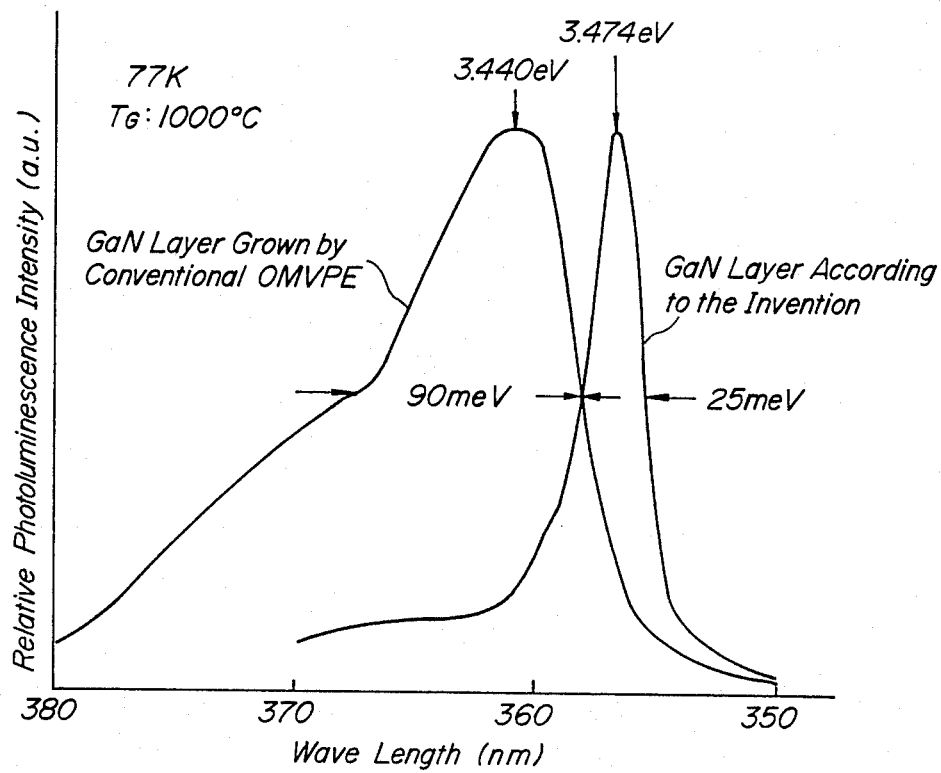
FIG_7
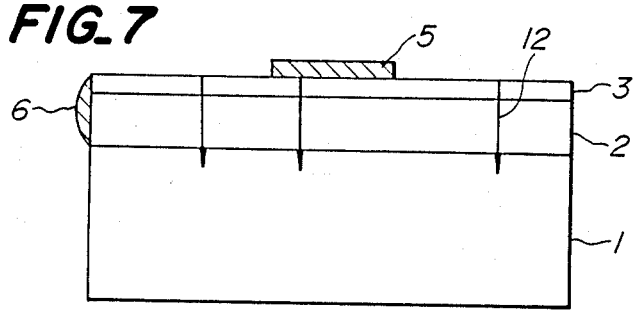

FIG_8
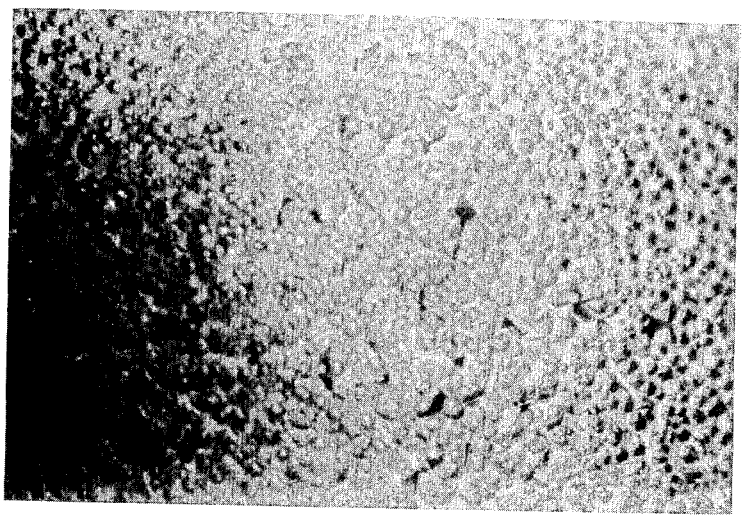
10μm

PROCESS FOR GROWING III-V COMPOUND SEMICONDUCTORS ON SAPPHIRE USING A BUFFER LAYER

This is a continuation of Ser. No. 931,822, filed on Nov. 18, 1986 now abandoned.

BACKGROUND OF THE INVENTION

1. Field of the Invention

The present invention relates to a process for growing compound semiconductors wherein $Al_xGa_{1-x}N$ films are grown on sapphire substrates, and particularly to an improvement in the process for growing compound semiconductors by means of organometallic vapor phase epitaxy (OMVPE).

2. Related Art Statement

Although $Al_xGa_{1-x}N$ has been expected as one of the most promising materials for blue or ultraviolet light emitting devices because of its direct band gap of 3.39~6.2 eV, its homogeneous crystals of high quality having large surface areas have so far been difficult to be provided by conventional processes for growing single crystals.

In conventional processes, GaN films are generally grown hetero-epitaxially on sapphire substrates by hydride vapor phase epitaxial processes (HVPE) using Ga—HCl—NH$_3$—N$_2$ system. A GaN light emitting diode has an MIS type structure as shown in FIG. 7. Namely, it consists of: a sapphire substrate 1; a GaN layer grown on the substrate, consisting of n-type GaN film 2 and high resistive (insulating) GaN (i-GaN) film 3 doped with a considerable amount of Zn; and electrodes 5, 6 formed on the GaN layer. In this instance, it is necessary to control with a high precision the thickness of i-GaN film 3 within 1 μm in order to determine the operating voltage of the light emitting diode. However, a high growth rate of no less than 30–60 μm/hr. that is a suitable condition for obtaining high quality crystals in the aforementioned hydride vapor phase expitaxial processes, does not allow the thickness of the formed film 3 to be controlled precisely within 1 μm, so that the operating voltage of the diode varies widely. Furthermore, for providing a high quality GaN layer, a thickness of at least 30 μm grown on the sapphire substrate is generally required. Namely, even the n-GaN film shown in FIG. 7 has to be 30 μm thick or more. However, if GaN grows beyond a certain extent of thickness on the sapphire substrate, cracks 12 are formed in the grown GaN layer and the sapphire substrate as shown in FIG. 7, owing to differences in lattice constant and thermal expansion coefficient between the grown GaN and the sapphire. The cracks in the wafer, particularly formed right below the electrode, may cause a current leakage and thus lead to the disadvantage of low production yields in the manufacture of light emitting diodes.

Therefore, organometallic vapor phase epitaxial processes with an organometallic compound system, such as trimethylgallium (TMG)—NH$_3$—H$_2$ system have been investigated, aiming at precise thickness controls of i-GaN films and growth of thin GaN films 10 μm thick or less, with a decreased growth rate. In such processes, an apparatus for deposition as shown in FIG. 2 is used. Namely, in a quartz tube reactor 7, a sapphire substrate 10 is placed on a graphite susceptor 9 for high-frequency induction heating, the sapphire substrate is heated by means of radio-frequency coil 8, then gaseous TMG, NH$_3$ and H$_2$ introduced from a raw material supply tube 11 are impinged on the substrate 10 and thus GaN films grow on the substrate 10. As procedures to be followed in this case, firstly, the substrate 10 is cleaned by heating at about 1,100° C. under H$_2$ flow, after which the temperature of the substrate is lowered to about 970° C. and then gaseous TMG and NH$_3$ are fed to grow GaN.

As the result, the growth rate is lowered to 1–3 μm/hr., whereby growth of uniform thin films 1–4 μm thick can be achieved. This is an advantage having never been obtainable by hydride vapor phase epitaxial processes. However, the thin films have rough surfaces where hexagonal columnar grains are observed, and their reflection high energy electron diffraction patterns (RHEED pattern) show a spot pattern characteristic of a single crystal having finely rugged surfaces, whereas, on the other hand, GaN films formed in accordance with hydride vapor phase epitaxial processes exhibit a streak line pattern characteristic of smooth surfaces.

SUMMARY OF THE INVENTION

An object of the present invention is, obviating the above-mentioned disadvantages, to provide a crystal growth process for obtaining $Al_xGa_{1-x}N$ single crystalline layers of high uniformity and high quality having smooth specular surfaces.

A further object of the present invention is to provide an epitaxial process by which multi-layered expitaxially grown films of single crystalline $Al_xGa_{1-x}N$ having preferable ultraviolet or blue light emission properties are mass-producible.

The present invention is a process for growing a compound semiconductor wherein an organometallic compound and NH$_3$ are reacted in an atmosphere of H$_2$ or H$_2$ mixed with N$_2$ to deposit at least one layer of single crystalline $Al_xGa_{1-x}N$ ($0 \leq x < 1$) on a sapphire substrate, characterized in that the sapphire substrate is subjected to a heat treatment of brief duration in an atmosphere comprising at least an Al-containing organometallic compound such as trimethylaluminum (TMA), NH$_3$ and H$_2$ at a temperature lower than the single crystalline AlN growing temperature i.e. about 1,200° C., after which single crystalline $Al_xGa_{1-x}N$ is grown epitaxially on the heat-treated sapphire substrate at a high temperature, preferably of 950°–1,150° C. The present invention has been accomplished after carrying out a host of experiments for various epitaxial growth and heat treatment processes, based on the recognition that either moderation, via some buffer layer, of the lattice constant mismatch between the grown $Al_xGa_{1-x}N$ and the sapphire or reformation of surfaces of the sapphire is necessary in order to improve the quality of crystalline $Al_xGa_{1-x}N$ grown on the sapphire substrate by an organometallic compound vapor phase expitaxial process.

The present invention will be described with reference to GaN (in the case where x=0 in $Al_xGa_{1-x}N$) as an example hereinafter.

BRIEF DESCRIPTION OF THE DRAWING

FIG. 1 is a schematic sectional view of a blue light emitting diode manufactured by the process of the present invention;

FIG. 2 is a diagrammatic view of an apparatus for organometallic vapor phase epitaxy to be used in the process of the present invention;

FIG. 3 is a SEM (scanning electron microscopy) photomicrograph of the surface of a GaN layer formed by the process of the present invention;

FIG. 4 is an electroluminescence spectrum of a light emitting diode manufactured by the process of the present invention;

FIG. 5 shows X-ray rocking curves for (0006) diffraction of GaN layers, one being grown by the present invention and the other by a conventional process;

FIG. 6 is photoluminescence spectra of GaN layers formed by the process of the present invention and a conventional OMVPE process respectively;

FIG. 7 is a schematic sectional view of a blue light emitting diode manufactured by a conventional process; and FIG. 8 is a SEM photomicrograph of the surface of a GaN layer formed by a conventional process.

DETAILED DESCRIPTION OF THE INVENTION

In depositing GaN on a sapphire substrate by using a deposition apparatus as shown in FIG. 2, a GaN layer grown directly on the substrate under the growth conditions given in Table 1(b) below is referred to as "conventionally grown layer", and a GaN layer grown under the growth conditions given in Table 1(b) on a substrate previously heat-treated under the conditions given in Table 1(a) according to the invention is referred to as "heating-and-grown layer" hereinafter.

TABLE 1

| (a) Heat- treatment conditions |
|---|
| Temperature: 900–1,000° C. |
| Time: 1 min. |
| Flow rate: |
| Trimethylaluminum: $7 \times 10^{-6}$ mol/min. |
| NH$_3$: 2 l/min. |
| H$_2$: 3 l/min. |
| (b) Growth conditions |
| Temperature: 970–1,030° C. |
| Growth time: 30 min. |
| Flow rate: |
| Trimethylgallium: $1.7 \times 10^{-5}$ mol/min. |
| NH$_3$: 1.5 l/min. |
| H$_2$: 2.5 l/min. |

Respective properties of the conventionally grown layer and the heating-and-grown layer were evaluated.

First, for evaluating the crystallinity, X-ray rocking curves were compared. As a result, the heating-and-grown layer exhibited (0006) diffraction of GaN having a full width at half-maximum (referred to as "half-width" hereinafter) of 2.7 minutes, while the conventionally HVPE grown layer, i.e., GaN layer formed by a hydride vapor phase epitaxial process, had that of no less than 10 minutes which had so far been regarded as good quality. Thus, it is demonstrated that the present invention provides films much better than any ones according to conventional HVPE processes.

Next, as to surface morphology, the heating-and-grown layer has a very smooth, flat and uniformly grown GaN surface as shown in the SEM photomicrograph in FIG. 3, which is particularly superior to the surface of the conventionally grown GaN layer shown in FIG. 8.

Further, through photoluminescence measurement at 77° K. by means of nitrogen laser excitation and from comparison of near band edge light emission, it has been found that heating-and-grown GaN layers show a narrower half-width and higher peak energy, as compared with conventionally grown GaN layers. The above findings prove the fact that, even from the standpoint of luminescence properties, heating-and-grown GaN layers, i.e. GaN according to the process of the present invention, are superior in the purity or quality of crystal to conventionally grown layers.

As explained above, when GaN is deposited under the conditions given in Table 1(b) after the sapphire substrate is subjected to a heat treatment under the conditions given in Table 1(a), the grown GaN films have prominently high quality in comparison with the conventionally grown GaN films. The reasons for this have not been elucidated but can be assumed that an amorphous AlN$_x$ ($x>0$) may be grown on the sapphire substrate. If the sapphire substrate is heat-treated at a temperature as high as 1,200° C. for a long period of time under the conditions of Table 1(a) except for the temperature, single crystalline AlN is formed on the sapphire. However, in the case of heat treatment at 900° C., it is most likely from the RHEED pattern that an amorphous compound composed of Al and N has been deposited on the surface of the sapphire.

Now, since experiments have not sufficiently enlightened the actual conditions and properties of such deposited films, the expression "heat treatment" is used herein for convenience of defining conditions of the pretreated substrate. If the duration of the heat treatment becomes too long, polycrystalline layers will be formed, so that the preferable heat treatment time is less than 2 minutes, more preferably not exceeding 1 minute. Further, a suitable heat treatment temperature of substrate is in the range between 800° C. and 1,100° C., more preferably in the range between 900° C. and 1,000° C. If the temperature is lower than 800° C., a number of pits, i.e., holes resulted from abnormal growth, will appear on the grown thin films which cannot be made to have high resistivity even if doped with Zn, and, therefore, not suitable for device fabrication. On the other hand, when the temperature exceeds 1,100° C., agglomeration of hexagonal grains will be formed on the surface of the film so that desired smooth, flat films are not obtainable.

For the Al$_x$Ga$_{1-x}$N eptaxial growth, a preferable temperature is in the range between 950° C. and 1,150° C., particularly between 970° C. and 1,030° C.

As is clear from the above, the heating-and-grown layer according to the invention consists of Al$_x$Ga$_{1-x}$N, particularly GaN, of high quality.

Although the foregoing description was made mainly with reference to GaN growth as an example, the present invention is also applicable efficaciously to epitaxial growth of Al$_x$Ga$_{1-x}$N where $0 \leq x < 1$, and particularly in the case where $0 \leq x \leq 0.3$, the effect is similar to that of GaN.

Some of the preferred embodiments of the present invention will be illustrated by way of the following examples.

Example 1

A single crystalline sapphire substrate 10 having a (0001) plane cleaned by degreasing with organic solvent and acid treatment was placed on a graphite susceptor 9 in an organometallic vapor phase deposition apparatus (quartz tube reactor having a diameter of 60 mm) as shown in FIG. 2. At the outset, as passing H$_2$ with a flow rate of 0.3 l/min. into the reactor, the temperature was raised to 1,100° C. to gas-etch the substrate for ten minutes. Then, the temperature was lowered to 950° C., and as feeding H$_2$ with a flow rate of 3 l/min, NH$_3$ of 2 l/min. and trimethylaluminum (TMA) of $7\times10^{-6}$ mol/min., heat treatment was carried out for 1 minute. At the end of the heat treatment, the supply of TMA was stopped and then $H_2$ having a flow rate of 2.5 l/min., $NH_3$ of 1.5 l/min. and trimethylgallium (TMG) of $1.7\times10^{-5}$ mol/min. were fed at 970° C. for 30 minutes to grow GaN. As a result, a GaN layer having a smooth, flat surface as shown in FIG. 3 and of excellent crystal quality exhibiting an X-ray rocking curve having a narrow half-width as shown in FIG. 5 was obtained.

As a source for Ga, triethylgallium (TEG) is also employable. In this case, a similar result can be obtained, if the temperature of TEG source is kept at 20° C. and $H_2$ gas is supplied with a flow rate of 56.5 ml/min. as bubbling. Further, when TEG is used, crystalline layer of higher purity can be expected.

Example 2

A single crystalline sapphire substrate 10 having a (0001) plane cleaned in accordance with the conditions described in Example 1 was placed on a susceptor 9 as shown in FIG. 2. At the outset, as passing $H_2$ gas with a flow rate of 0.3 l/min., the temperature was raised to 1,100° C. to gas-etch the sapphire substrate 10. Then, the temperature was lowered to 950° C., and as feeding $H_2$ with a flow rate of 3 l/min., $NH_3$ of 2 l/min. and TMA of $7\times10^{-6}$ mol/min., heat treatment was carried out for 1 minute. At the end of the heat treatment, the supply of TMA was stopped and then $H_2$ having a flow rate of 2.5 l/min., $NH_3$ of 1.5 l/min. and TMG of $1.7\times10^{-5}$ mol/min. were fed at 970° C. for 30 minutes to grow layers, after which in addition to TMG, diethylzinc (DEZ) was fed with a flow rate of about $5\times10^{-6}$ mol/min. to effect the growing of layer for 5 minutes. As a result, a layer consisting of n-GaN film 2 and Zn-doped i-GaN film 3 was formed on the sapphire substrate 1 as shown in FIG. 1. Different from that shown in FIG. 7, this layer was free from cracks. Electrodes 5 and 6 were formed on it, and upon application of electric current between anode 5 and cathode 6, blue light emission having a spectrum as shown in FIG. 4 was observed near the interface 4 between films 3 and 2 and right below the anode 5.

EXAMPLE 3

A single crystalline sapphire substrate 10 having a (0001) plane cleaned in accordance with the conditions described in Example 1 was placed on a susceptor 9 as shown in FIG. 2. At the outset, as passing $H_2$ with a flow rate of 0.3 l/min., the temperature was raised to 1,100° C. to gas-etch the sapphire substrate. Then, the temperature was lowered to 950° C., and as feeding $H_2$ with a flow rate of 3 l/min., $NH_3$ of 2 l/min. and TMA of $7\times10^{-6}$ mol/min., heat treatment was carried out for 1 minute. After the heat treatment, as additionally feeding TMG with a flow rate of $1.7\times10^{-5}$ mol/min., a layer was grown at 1,105° C. for 15 minutes. In this case, a thin film of $Al_{0.3}Ga_{0.7}N$, i.e. $Al_xGa_{1-x}N$ wherein $x=0.3$, having a smooth, flat surface was obtained.

Further, it was found that films having a smooth, flat surface were obtainable according to similar processes, particularly when $0\leq x\leq0.3$.

As has been demonstrated above, the present invention, in accordance with organometallic vapor phase epitaxial processes having mass-productivity as proved in cases of GaAs, etc., can grow single Crystalline $Al_xGa_{1-x}N$ of high uniformity and good quality.

Accordingly, the present invention can be utilized efficaciously in the manufacture of blue light emitting diodes, blue laser diodes, etc. now behindhand in quality and mass-productivity improvements, and is, therefore, industrially very beneficial.

While there has been shown and described the preferred embodiments of the present invention, it will be obvious to those skilled in the art that various alterations and modifications thereof can be made without departing from the scope of the invention as defined by the following claims.

What is claimed is:

1. A process for growing a compound semiconductor wherein an organometallic compound and ammonia gas (NH3) are reacted in hydrogen gas ($H_2$) or hydrogen gas mixed with nitrogen gas ($N_2$) to grow epitaxially at least one layer of single crystalline $Al_xGa_{1-x}N$ ($0\leq x<1$) on a sapphire substrate, said process comprising subjecting the sapphire substrate to a heat treatment of brief duration in a atmosphere comprising at least an Al-containing organometallic compound, $NH_3$, and $H_2$ at a temperature lower than the single crystalline AlN growing temperature to deposit a non-single crystalline buffer layer of an AlN compound on the surface of the sapphire substrate and thereafter growing epitaxially at a high temperature said single crystalline $Al_xGa_{1-x}N$ directly on said non-single crystalline buffer layer.

2. A process as claimed in claim 1, wherein the temperature in the heat treatment of the sapphire substrate is in the range between 800° C. and 1,100° C.

3. A process as claimed in claim 2, wherein said temperature is from 900° C. to 1,000° C.

4. A process as claimed in claim 1, wherein the temperature for the epitaxial growth of $Al_xGa_{1-x}N$ is in the range between 950° C. and 1,150° C.

5. A process as claimed in claim 4, wherein said temperature is from 970° C. to 1,030° C.

6. A process as claimed in claim 1, wherein the subscript x of the formula, $Al_xGa_{1-x}N$, is form 0 to 0.3 inclusive.

7. A process as claimed in claim 1, wherein the duration of heat treatment is less than 2 minutes.

8. A process as claimed in claim 7, wherein said duration of heat treatment is not exceeding 1 minute.

9. A process as claimed in claim 1, wherein said Al-containing organometallic compound is trimethylaluninum.

* * * * *